US006886126B1

(12) United States Patent
Grivna et al.

(10) Patent No.: US 6,886,126 B1
(45) Date of Patent: Apr. 26, 2005

(54) APPARATUS AND PROTOCOL FOR DETECTED ERROR PROPAGATION IN SERIAL-TRANSPORT BLOCK-CODED INTERFACES

(75) Inventors: Edward L. Grivna, Brooklyn Park, MN (US); Paul H. Scott, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/534,108

(22) Filed: Mar. 23, 2000

(51) Int. Cl.[7] .......................................... H03M 13/00
(52) U.S. Cl. ...................................................... 714/752
(58) Field of Search ................................ 714/752, 758, 714/746, 786

(56) References Cited

U.S. PATENT DOCUMENTS

| 3,646,517 | A | * | 2/1972 | Waters et al. ............... 714/811 |
| 3,893,072 | A | * | 7/1975 | D'Antonio et al. ......... 714/751 |
| 4,903,270 | A | * | 2/1990 | Johnson et al. ............. 714/820 |
| 5,001,712 | A | * | 3/1991 | Splett et al. ................. 714/703 |
| 5,872,910 | A | * | 2/1999 | Kuslak et al. ................ 714/41 |
| 5,946,300 | A | * | 8/1999 | Wilbrod ....................... 370/241 |
| 5,949,799 | A |   | 9/1999 | Grivna et al. ................ 371/33 |
| 6,170,073 | B1 | * | 1/2001 | Jarvinen et al. ............. 714/758 |
| 6,173,423 | B1 | * | 1/2001 | Autechaud et al. ......... 714/703 |
| 6,182,248 | B1 | * | 1/2001 | Armstrong et al. ........... 714/43 |
| 6,188,702 | B1 | * | 2/2001 | Tornetta et al. .............. 370/535 |
| 6,233,073 | B1 | * | 5/2001 | Bowers et al. ............... 359/110 |
| 6,295,010 | B1 | * | 9/2001 | Thiesfeld ....................... 341/58 |
| 6,304,984 | B1 | * | 10/2001 | Neal et al. ..................... 714/57 |

* cited by examiner

Primary Examiner—Albert Decady
Assistant Examiner—Esaw T Abraham
(74) Attorney, Agent, or Firm—Christopher P. Maiorana, PC

(57) ABSTRACT

An apparatus comprising a first circuit and a second circuit. The first circuit may be configured to generate a first select signal, a second select signal and a first data stream in response to an input data stream and a redundancy signal. The second circuit may be configured to generate an output data stream in response to the first data stream, the first select signal and the second select signal. The second circuit may be configured to replace one or more characters of the first data stream.

14 Claims, 3 Drawing Sheets

APPARATUS AND PROTOCOL FOR DETECTED ERROR PROPAGATION IN SERIAL-TRANSPORT BLOCK-CODED INTERFACES

FIELD OF THE INVENTION

The present invention relates to a method and/or architecture for propagating a detected error in a source data stream generally and, more particularly, to a method and/or architecture for propagating a detected error in a source data stream across a communications channel (e.g., link) that does not normally carry parity information.

BACKGROUND OF THE INVENTION

Conventional methods for detecting and correcting data errors generally attempt to detect and correct such errors by transmitting redundant data. The redundant data is sent across a communications channel that is implemented to validate the data following a reception of the data. Examples of conventional redundant data detection/correction systems include cyclic redundancy check (CRC), checksum, and forward error correction (FEC). Since conventional methods operate after reception of the complete data packet or frame construct, such conventional methods induce additional delay into communications channel recovery time when responding to such errors.

For conventional systems, an invalid character is generally transmitted as some other valid character. By transmitting a valid character, normal communications channel data protection mechanisms are less likely to detect the error.

Conventional methods implement inclusion of redundant data sent across a communications channel to validate the data following reception. Conventional systems transmit valid data or corrected data as valid characters and invalid (uncorrectable) data as valid or invalid characters. The normal communications channel data protection mechanisms (i.e., CRC, FEC, etc.) will detect the error and deal with the error properly. System protection mechanisms that are based only on transportation of redundant data are deficient with specific types of faults or corruptions of the data.

SUMMARY OF THE INVENTION

The present invention concerns an apparatus comprising a first circuit and a second circuit. The first circuit may be configured to generate a first select signal, a second select signal and a first data stream in response to an input data stream and a redundancy signal. The second circuit may be configured to generate an output data stream in response to the first data stream, the first select signal, and the second select signal. The second circuit may be configured to replace one or more characters of the first data stream.

The objects, features and advantages of the present invention include providing a method and/or architecture for propagating detected errors in a source data stream that may (i) reduce delay in communications channel recovery time by forcing the detection at a communications channel receiver, (ii) allow improved correction capability of a correction code by providing error location information to a remote receiver of the source data stream and/or (iii) work with existing forms of communications channel data protection to provide improved detection capability of communications channel data errors at the receiver.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
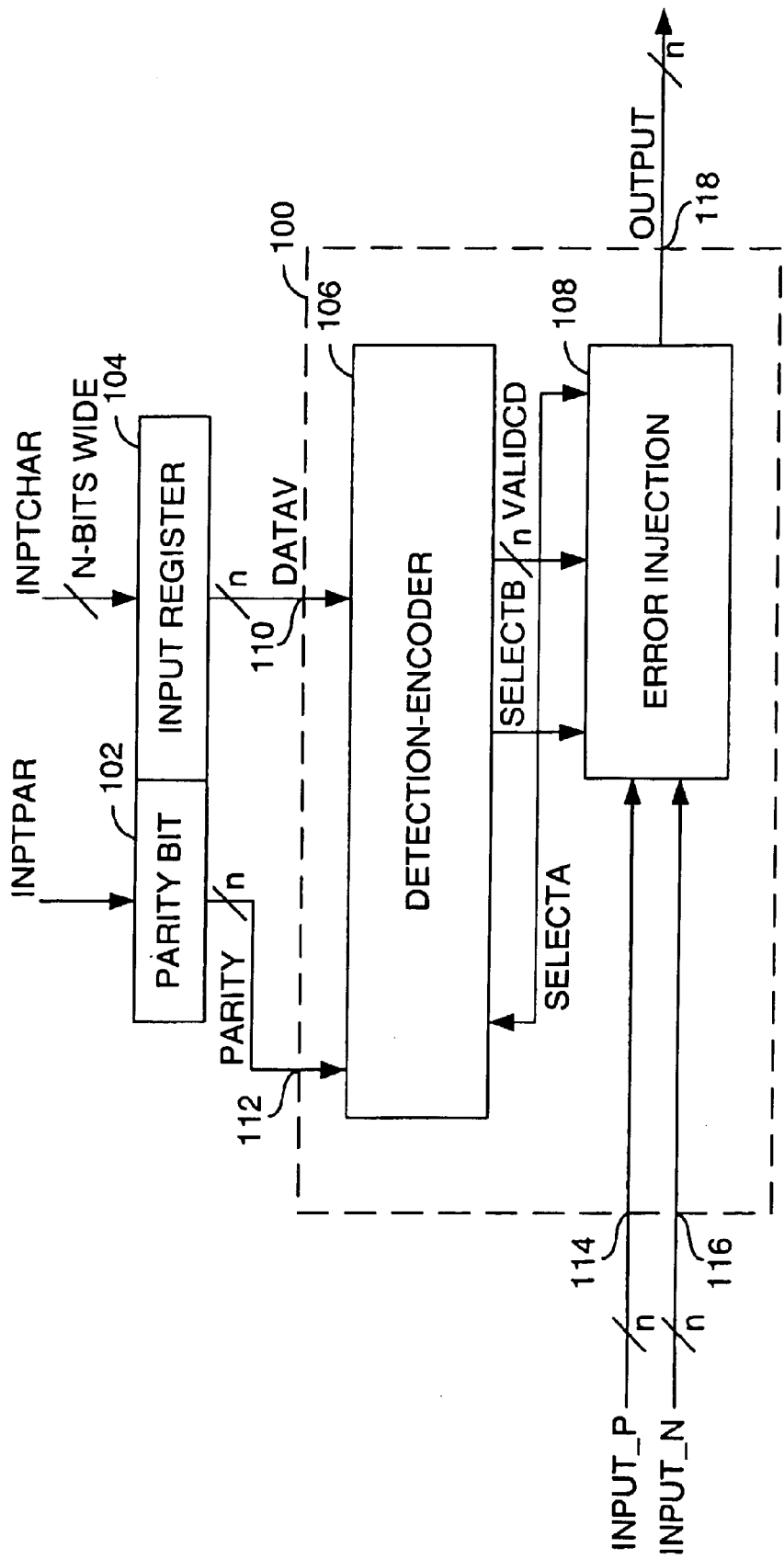
FIG. 1 is a block diagram of a preferred embodiment of the present invention.

Referring to FIG. 1, a block diagram of a circuit 100 is shown in accordance with a preferred embodiment of the present invention. The circuit 100 may be implemented to propagate detection of data errors. The data errors may be either (i) present or (ii) detected in a source data stream. Additionally, the data errors may be presented to a remote location across a serial data stream using block-coded characters. The circuit 100 may be implemented without interfering with a normal operation of a protocol, which may be required in high-integrity data environments (e.g., banking, financial transactions and/or calculation based systems).

The circuit 100 may be implemented as, in one example, an error detection/propagation circuit. FIG. 1 may illustrate an implementation of the detection/propagation circuit 100. The circuit 100 may receive a redundancy signal or bit (e.g., PARITY) from a register 102. An input register 104 may present a signal DATAV. The circuit 100 generally comprises a detection-encoder block (or circuit) 106 and an error injection block (or circuit) 108. In one example, the detection-encoder circuit 106 may be implemented as an error detection circuit and the error injection circuit 108 may be implemented as a character propagation circuit.

The circuit 100 may have an input 110 that may receive a data signal (e.g., DATAV), an input 112 that may receive the redundancy signal PARITY, an input 114 that may receive a positive disparity character signal (e.g., INPUT_P) and an input 116 that may receive a negative disparity character signal (e.g., INPUT_N). However, other forms of data encoding that do not make use of disparity tracking may only require a single character. The circuit 100 may have an output 118 that may present an output signal (e.g., OUTPUT). The signal OUTPUT may be generated in response to the signal DATAV, the signal PARITY, and the signal SELECTB. The signals PARITY, DATAV, VALIDCD, INPUT_P, INPUT_N and OUTPUT may each independently be n-bits wide, where n is an integer. The signals PARITY, DATAV, VALIDCD, INPUT_P, INPUT_N and OUTPUT may be different bit-widths.

Figure 2:
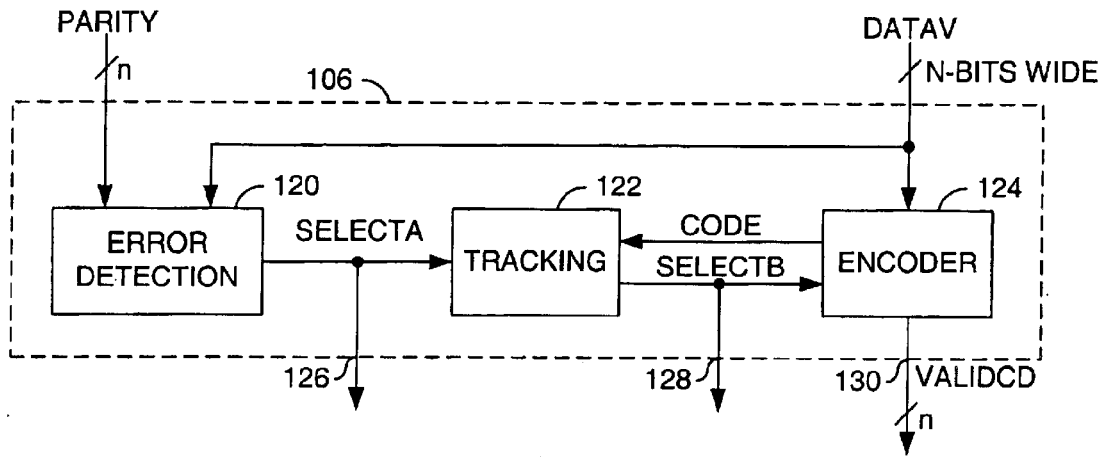
FIG. 2 is a detailed block diagram of an error detection-encoder circuit of FIG. 1.

Referring to FIG. 2, a more detailed block diagram of the detection-encoder circuit 106 is shown. The detection-encoder circuit 106 generally comprises an error detection block (or circuit) 120, a tracking block (or circuit) 122 and an encoder block (or circuit) 124. In one example, the error detection circuit 120 may be implemented as a parity check circuit and the tracking circuit 122 may be implemented as a disparity tracking circuit. However, the check circuit 120 and the tracking circuit 122 may each be implemented as appropriate circuitry needed to meet the criteria of a particular implementation. The detection-encoder circuit 106 may have an output 126 that may present a select signal (e.g., SELECTA) in response to the signal DATAV and the signal PARITY. The detection-encoder circuit 106 may have an output 128 that may present a select signal (e.g., SELECTB). The tracking circuit 122 may generate the signal SELECTB in response to the signal SELECTA or a signal (e.g., CODE). The detection-encoder circuit 106 may have an output 130 that may present a data signal (e.g., VALIDCD). The encoder circuit 124 may present the signal CODE and the signal VALIDCD in response to the signal DATAV and the signal SELECTB. The signal VALIDCD may be n-bits wide, where n is an integer. The signal VALIDCD may have a bus width equivalent to the bus width of the signal INPUT_P and/or the signal INPUT_N.

Figure 3:
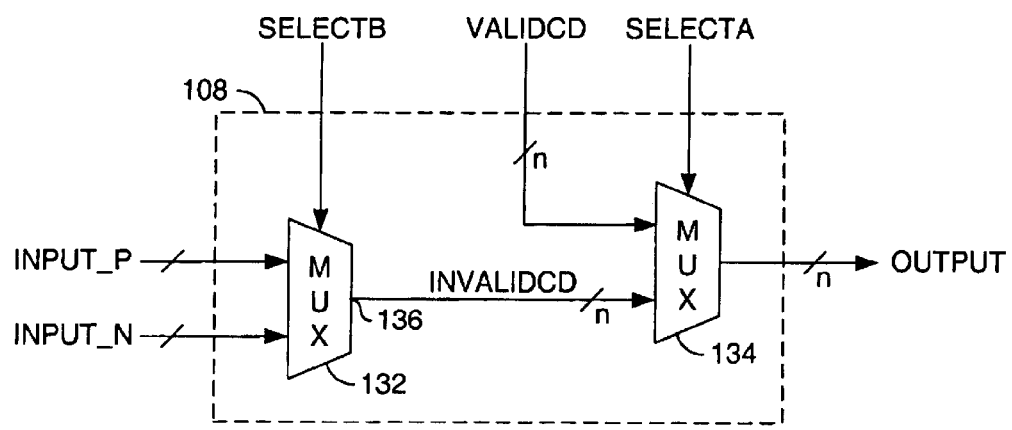
FIG. 3 is a detailed block diagram of an error injection circuit of FIG. 1.
Figure 4:
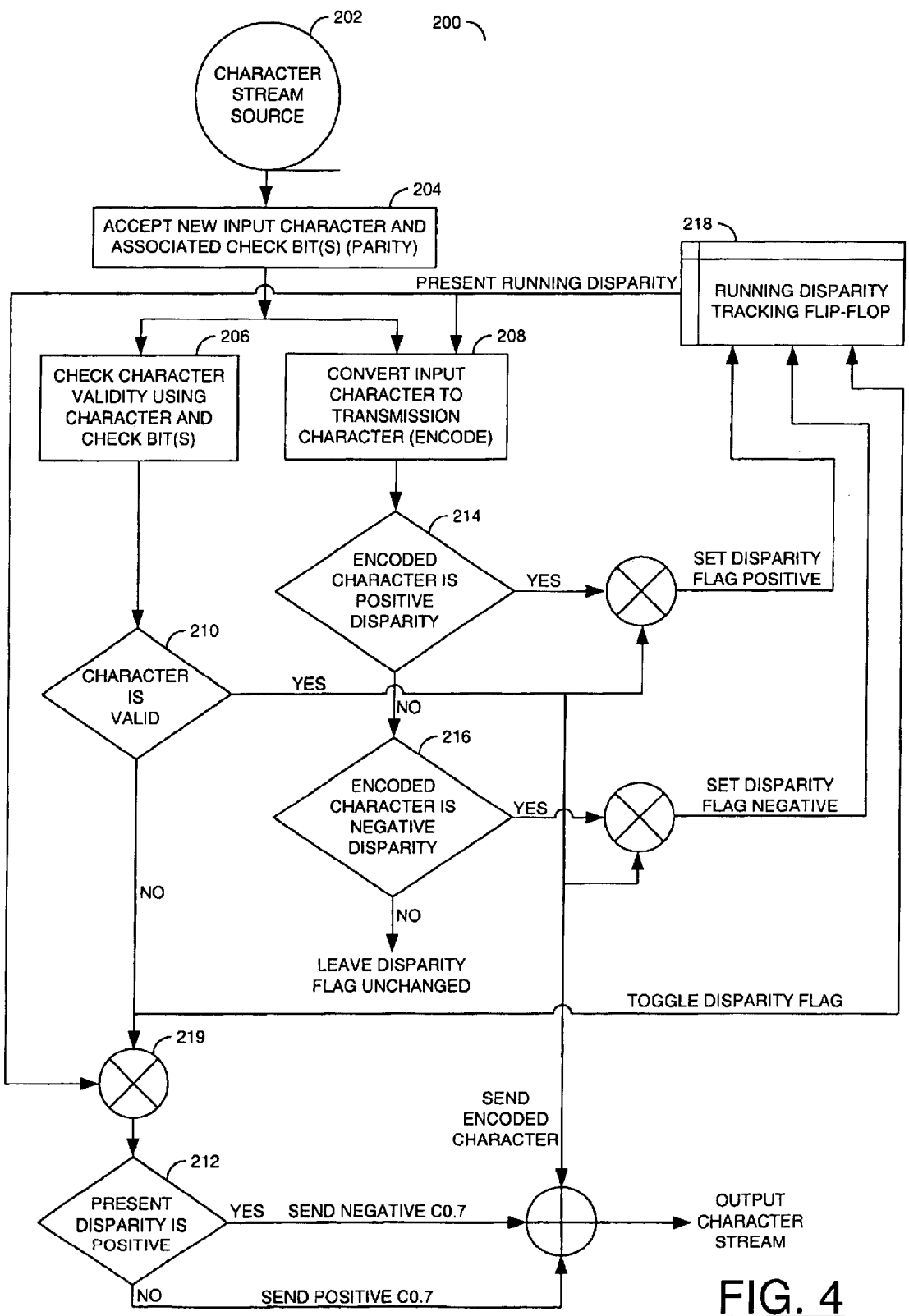
FIG. 4 is a flow chart illustrating an operation of the present invention.

Referring to FIG. 3, a more detailed block diagram of the error injection circuit 108 is shown. The error injection circuit 108 generally comprises a multiplexer 132 and a multiplexer 134. However, the error injection circuit 108 may not require the multiplexer 132 when implemented for data encoding that does not make use of disparity tracking. The multiplexers 132 and 134 may be implemented, in one example, as an n-bit wide group of 2 to 1 multiplexers, where n is an integer. However, other appropriate multiplexers may be implemented in order to meet the design criteria of a particular implementation. The multiplexer 132 may have an output 136 that may present a data signal (e.g., INVALIDCD). The multiplexer 132 may receive the signal SELECTB, the signal INPUT_P and the signal INPUT_N. The signals INPUT_P and INPUT_N may, in one example, be implemented as positive and negative disparity encoded character signals, respectively. However, the signals INPUT_P and INPUT_N may each be implemented as appropriate signals in order to meet the criteria of a particular implementation. The multiplexer 132 may present the signal INVALIDCD by selecting either the signal INPUT_P or the signal INPUT_N, in response to the signal SELECTB. The multiplexer 132 may present the signal INVALIDCD.

The multiplexer 134 may be configured to present the signal OUTPUT. The multiplexer 134 may receive the signal VALIDCD, the signal INVALIDCD and the signal SELECTA. The multiplexer 134 may present the signal OUTPUT by selecting either the signal VALIDCD or the signal INVALIDCD, in response to the signal SELECTA.

The circuit 100 may be implemented, in one example, to operate on a transmit side of a communications channel. Each character of the signal DATAV may be validated by the parity check circuit 120 at a same time that a character may be encoded by the encoder circuit 124. If the character is detected as being invalid, the character may be replaced at the output of the multiplexer 134 as selected by the signal SELECTA with a transmission character. The transmission character may not be recognized at a remote receiver as a valid character. An example of the character to be implemented as the invalid character may be the C0.7 character as identified in the CY7B923/CY7B933 datasheet, which is hereby incorporated by reference in its entirety. However, other appropriate characters may be implemented accordingly to meet the design criteria of a particular implementation.

To prevent corruption of any following characters in the data stream DATAV, the C0.7 character may be available in both positive (e.g., the signal INPUT_P) and negative (e.g., the signal INPUT_N) disparity forms. The proper disparity version of the C0.7 character may be presented as the signal OUTPUT when an error is detected. The circuit 100 may limit error propagation to only those characters detected in error at the source by the parity check block 120. Additionally, limitations on error propagation (the total for the communications channel) may be limited to the errors detected at the source (DATAV) acted on by the circuit 100, plus errors that may occur on the communications channel of any characters that may be corrupted as part of normal communications channel transmission. In general, no additional characters may be detected as corrupt due to the encoding of the characters at the transmitter (e.g., the signal OUTPUT).

The C0.7 character may be encoded as either (i) a first encoded form 011000 0111 (e.g., the positive disparity signal INPUT_P) or (ii) a second encoded form 100111 1000 (e.g., the negative disparity signal INPUT_N). The first encoded form is generally transmitted if the current running disparity is negative when the error is typically detected and/or transmitted. The second encoded form is generally transmitted if the current running disparity is positive when the error is typically detected and/or transmitted.

The circuit 100 may be implemented in conjunction with existing forms of communications channel data protection to improve the detection capability of communications channel data errors at the receiver. When implemented with specific forms of FEC, the circuit 100 may also improve the correction capability of the correction code by providing error location information.

The error detection-encoder circuit 106 may be implemented at the transmit end of an interface. The error detection-encoder circuit 106 may be modified accordingly to meet the design criteria of a particular implementation. Furthermore, the particular character substituted in place of an invalid character may be varied accordingly to meet the design criteria of a particular implementation.

The circuit 100 may implement odd or even parity checking for error detection. However, other methods (e.g., all with higher data redundancy than parity) may be available to detect errors on the data (e.g., running checksum, running CRC, SECDED, etc.). The particular form of redundancy may be varied. The detection of the invalid data prior to transport of the data may provide proper operation of the circuit 100.

Alternatively, the circuit 100 may modify the specific non-data character used to replace the invalid data when sent across the communications channel. The circuit 100 may not implement a normal data character to replace the invalid data (since all the normal data characters are presently implemented for normal transportation). Furthermore, the replacement character is not generally one of the special character codes used for transport of normal protocol information. Within standardized protocols (e.g., ANSI/NCITS X3.230-1994 Fibre Channel, ESCON, or IEEE 802.3z Gigabit Ethernet) and their use of the 8B/10B code for data transport, not all of the twelve available non-data characters are used by the protocol. Such an implementation may allow one of the available non-data characters to be implemented to transport the detection of invalid data or invalid non-data characters used by the protocol.

When the circuit 100 is implemented with user-defined protocols, all the non-data characters that are normally part of the character set may be allocated to the transport protocol. Such an implementation generally requires the allocation of an invalid character in the encoded character space (e.g., an invalid transmission character) to convey the detection of an invalid data or non-data character in the non-encoded domain. Since the encoded character space may be quite large, the specific character selected is generally not critical. However, for encoding formats that operate with disparity tracking, the character must generally be available in two disparity forms to prevent expansion of a single character error at the source into two or more characters in error at the receiver.

The selection of a character outside the normal data and non-data character space may not limit the error detection or reporting capabilities of the interface. When an invalid character is detected at the transmitter and replaced with the selected invalid transmission character, the local transmitter generally has knowledge that an invalid data or non-data character was detected. When the communications channel receiver detects the presence of the invalid character in the encoded character space (e.g., an invalid transmission character) the location of the character, relative to that of the replaced character, may be communicated back to the source to rule out corruption of data while in serial transport. In addition, the receiver action with respect to the detection of an error generally remains the same regardless of whether the character detected in error was caused by replacement at the transmitter or by actual corruption during transport.

The circuit 100 may provide the ability to propagate error location information across a communications channel carrying block-coded data. When data is sent containing FEC characters, the correction capabilities of the error correction code may be extended if the location of the error in the received data is known. For non-FEC systems, the error detection circuits may allow the receiver to discard the packet as soon as the character in error is detected, allowing the system to release resources and re-queue the packet for retransmission. The circuit 100 may also provide the ability to transport and maintain running-disparity integrity in the presence of invalid source data. If the data stream is disrupted at a transmitter without control of running disparity, the reception of a character in error may cause adjacent characters to also be detected in error.

The circuit 100 may be of importance to those data transport environments that cannot tolerate an undetected data error. Such environments are most prominent in enterprise data storage implementations where all data paths must carry either parity or some other form of error detection/protection. Detection and propagation capability may be of considerable importance in many commercial applications.

The flow chart 200 may illustrate an operation of the circuit 100. The flow chart 200 may illustrate checking character validity of a data stream using character bits and check bits. The flow chart 200 may receive a data stream at a character stream source block 202. An accept new input character and associated check bits block 204 may receive the data source 202. The input characters and associated check bits block 204 may present a signal to a check character validity block 206 and an encode block 208. The check character validity block 206 may check character validity using character and check bits. The encode block 208 may convert input characters to transmission characters. Additionally, the encode block 208 may receive a present running disparity signal.

A check block 210 may determine if a character is valid. If the character is valid the check block 210 may present a send encoded character signal. If the character is invalid, the check block 210 may present a toggle disparity flag signal. The toggle disparity flag signal may be presented to a running disparity tracking flip-flop 218. If the character is invalid, the check block 210 may also present a signal to an AND function. The AND function may logically combine the character invalid signal from the check block 200 with the present running disparity of the flow chart 200.

A check block 214 may determine if an encoded output from the encoder 208 has a positive disparity. If the encoded output has a positive disparity, and the character validity check block 210 indicates that the character is valid, a set disparity flag positive signal may be generated. The set disparity flag positive signal may be presented to the running disparity tracking flip-flop 218. The set disparity flag positive signal may set the disparity tracking flip-flop 218. If the encoded output does not have positive disparity, the encoded output is generally presented to check block 216. The check block 216 may determine if the encoded character has negative disparity. If the encoded character has negative disparity, and the character validity check block 210 indicates that the character is valid, a set disparity flag negative signal is generated. The set disparity flag negative signal may clear the disparity tracking flip-flop 218. The set disparity flag negative signal may be presented to the running disparity tracking flip-flop 218. If the encoded output does not have a negative disparity, the character is neutral and no signal is presented to the disparity tracking flip-flop 218. If the encoded output does not have a negative disparity, the present state of the disparity tracking flip-flop 218 remains unchanged.

The running disparity tracking block 218 may present the present running disparity signal. The present running disparity flag signal is generally presented to the character encoder function 208. The present running disparity flag signal is presented to an AND function 219 with the invalid output of the character validity check block 210. An output of the AND function 219 may be presented to a check block 212. The check block 212 may determine if the present disparity is positive. If the present disparity is positive the check block 212 may present a negative disparity character. If the present disparity is negative the check block 212 may present a positive disparity character. The positive and/or negative disparity characters may be presented to an output character stream. Additionally the check block 210 may present a send encoded character signal if the character to be checked is valid. If the send encoded character signal is present, the output character stream may receive the encoded character from the encoder block 208. The flow chart 200 may present an output character stream in response to the positive and/or negative disparity character, the encoded character generated by the encoder block 208, and the check block 210.

The function performed by the circuit 100 may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s)

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMs, RAMs, EPROMs, EEPROMs, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first circuit configured to (a) generate a first select signal, a second select signal and a first data stream in response to an input data stream and a redundancy signal and (b) detect data errors in said input data stream in response to said redundancy signal and said first data stream; and
    a second circuit configured to generate an output data stream in response to said first data stream, said first select signal and said second select signal, wherein said second circuit is configured to replace one or more characters of said first data stream with either (i) a positive disparity character or (ii) a negative disparity character, in response to said first and second select signals.

2. The apparatus according to claim 1, wherein said redundancy signal comprises a parity signal.

3. The apparatus according to claim 1, wherein said second circuit is further configured to replace each of said one or more characters with a transmission character.

4. The apparatus according to claim 3, wherein said second circuit encodes and/or transmits (i) said positive disparity character if a current running disparity is negative or (ii) said negative disparity character if the current running disparity is positive.

5. The apparatus according to claim 3, wherein said first circuit comprises (i) a check circuit configured to present said first signal in response to said redundancy signal and said input data stream, (ii) a tracking circuit configured to present said second select signal in response to said first select signal and a code signal and (iii) an encoder circuit configured to present said first data stream and said code signal in response to said second select signal and said data input stream.

6. The apparatus according to claim 1, wherein said first circuit comprises a detection-encoder circuit and said second circuit comprises an error injection circuit.

7. The apparatus according to claim 6, wherein said second circuit comprises a first multiplexer configured to multiplex said first data stream and an error injection path in response to said first signal to present said output data stream.

8. The apparatus according to claim 7, wherein said second circuit is further configured to generate said output data stream in response to a first and a second disparity signal.

9. The apparatus according to claim 8, wherein said second circuit further comprises a second multiplexer configured to multiplex said first and second disparity signals in response to said second select signal and present said error injection path.

10. The apparatus according to claim 9, wherein said output of said second multiplexer comprises an invalid data stream and said first data stream comprises a valid data stream.

11. The apparatus according to claim 10, wherein said check circuit is further configured to validate a plurality of characters of said input data stream.

12. An apparatus comprising:
    means for generating a first select signal, a second select signal and a first data stream in response to an input data stream and a redundancy signal;
    means for generating an output data stream in response to said first data stream, said first select signal and said second select signal; and
    means for replacing one or more characters of said first data stream with either (i) a positive disparity character or (ii) a negative disparity character, in response to said first and second select signals.

13. A method for propagating detected errors in a data stream, comprising the steps of:
    (A) checking for one or more invalid character in said data stream;
    (B) replacing said one or more invalid characters of said data stream; and
    (C) replacing said one or more invalid characters with a transmission character having either a positive or a negative disparity form by encoding and transmitting (i) said positive disparity form if a current running disparity is negative or (ii) said negative disparity form if said current running disparity is positive.

14. The method according to claim 13, wherein step (A) further comprises validating a plurality of characters of said input data stream.

* * * * *